United States Patent
Tuan

(10) Patent No.: US 7,620,926 B1
(45) Date of Patent: Nov. 17, 2009

(54) METHODS AND STRUCTURES FOR FLEXIBLE POWER MANAGEMENT IN INTEGRATED CIRCUITS

(75) Inventor: Tim Tuan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 372 days.

(21) Appl. No.: 11/725,875

(22) Filed: Mar. 20, 2007

(51) Int. Cl.
G06F 9/45 (2006.01)
H03K 19/00 (2006.01)
H01L 25/00 (2006.01)

(52) U.S. Cl. .................. 716/16; 716/2; 716/5; 716/10; 716/17; 716/18; 326/41; 326/93; 326/101

(58) Field of Classification Search .................. 716/2, 716/5, 10, 16, 18; 326/38, 39, 41, 44, 93
See application file for complete search history.

(56) References Cited

U.S. PATENT DOCUMENTS

| | | | |
|---|---|---|---|
| 6,363,515 B1 * | 3/2002 | Rajgopal et al. ............. | 716/5 |
| 6,696,856 B1 * | 2/2004 | Smith et al. .................. | 326/39 |
| 6,944,843 B2 * | 9/2005 | Bansal .......................... | 716/16 |
| 6,996,787 B2 * | 2/2006 | Houston ........................ | 716/2 |
| 7,098,689 B1 * | 8/2006 | Tuan et al. .................... | 326/44 |
| 7,266,787 B2 * | 9/2007 | Hughes et al. ................ | 716/1 |
| 7,370,293 B2 * | 5/2008 | Yamagata ...................... | 716/2 |
| 7,400,175 B2 * | 7/2008 | Fallah et al. .................. | 326/93 |
| 7,417,454 B1 * | 8/2008 | Rahman et al. ............... | 326/38 |
| 7,477,073 B1 * | 1/2009 | Tuan et al. .................... | 326/41 |
| 7,498,835 B1 * | 3/2009 | Rahman et al. ............... | 326/38 |
| 7,498,836 B1 * | 3/2009 | Tuan ............................. | 326/38 |
| 7,498,839 B1 * | 3/2009 | Jenkins ......................... | 326/41 |
| 7,509,613 B2 * | 3/2009 | Frenkil ......................... | 716/10 |
| 2005/0034095 A1 * | 2/2005 | Bansal .......................... | 716/18 |
| 2005/0192787 A1 * | 9/2005 | Kuwahara et al. ............ | 703/18 |
| 2006/0265681 A1 * | 11/2006 | Bakir et al. ................... | 716/10 |
| 2009/0115452 A1 * | 5/2009 | Ichinomiya .................. | 326/38 |

OTHER PUBLICATIONS

Tran et al.; "95% Leakage-Reduced FPGA using Zigzag Power-gating, Dual-VTH/VDD and Micro-VDD-Hopping"; Nov. 2005; Asian Solid-State Circuits Conference; pp. 149-152.*

* cited by examiner

*Primary Examiner*—Helen Rossoshek
(74) *Attorney, Agent, or Firm*—Lois D. Cartier

(57) ABSTRACT

Structures and methods of efficiently implementing power management in integrated circuits (ICs). An IC includes columns of logic blocks and columns of power management blocks (PMBs). The columns of PMBs and logic blocks are placed alternately across the IC, with each PMB being coupled to a logic block in an adjacent column, and the logic blocks are coupled to each other across the columns of PMBs. The PMBs can be implemented, for example, using power gates coupled between a global power rail (either ground or power high) and a local power rail specific to the associated logic block. A PMB can be selected from a library of interchangeable PMBs based on power and performance requirements of a target application. Because the PMB is designed as a separate block, any of the interchangeable PMBs in the library can readily be included in the IC.

10 Claims, 10 Drawing Sheets

METHODS AND STRUCTURES FOR FLEXIBLE POWER MANAGEMENT IN INTEGRATED CIRCUITS

FIELD OF THE INVENTION

The invention relates to integrated circuits (ICs). More particularly, the invention relates to methods and structures of implementing power management in integrated circuits.

BACKGROUND

Programmable logic devices (PLDs) are a well-known type of IC that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

FIG. 1 is a simplified illustration of an exemplary FPGA. The FPGA of FIG. 1 includes an array of configurable logic blocks (CLBs 101-116) interconnected by a programmable interconnect structure that includes horizontal interconnect lines 120 and vertical interconnect lines 130.

Programmable ICs include many structures designed to support the programmable nature of the devices, e.g., configuration logic, configuration memory cells, control logic, and so forth. (The term "programmable ICs" as used herein includes but is not limited to FPGAs, mask programmable devices, Programmable Logic Devices (PLDs), and devices in which only a portion of the logic is programmable.) Therefore, a programmable IC, when programmed to implement a user design, may consume more power than a custom-designed IC that performs the same functions. Reduced power consumption is desirable to increase battery life, reduce operating temperatures, and improve reliability, for example. Therefore, programmable ICs are typically designed using various techniques having the object of reducing power consumption.

For example, FIG. 2 illustrates one known method of reducing power consumption in a programmable IC. Similar to FIG. 1, the FPGA of FIG. 2 includes an array of CLBs 201-216 interconnected by horizontal and vertical interconnect lines (220 and 230, respectively). However, in the FPGA of FIG. 2, each CLB includes a Power Management Block (PMB) that optionally turns off or reduces power to the CLB. Thus, power can be turned off or reduced when the CLB (or the entire FPGA) is not in use, thereby reducing the power consumption of the FPGA when the CLB is inactive.

The technique shown in FIG. 2 comes at a price, however. Reduced power consumption means reduced speed, and vice versa. The design of a PMB can significantly affect the performance of the IC, e.g., resulting in as much as a 1000× power difference and a 10× speed difference. Further, there is no one fixed PMB design that will suit all markets. For example, certain battery-operated devices may require very low power (e.g., in the microwatt range) but have a fairly low performance need (e.g., below 20 megahertz (MHz)), consumer electronics may require modest power (milliwatts) and modest performance (e.g., below 100 MHz), while high-speed data processing applications may have a generous power budget (e.g., several watts) but require very high performance (e.g., greater than 200 MHz).

Therefore, in order to reduce power consumption without unnecessarily reducing the maximum operating speed of the IC, the PMB is typically carefully designed to meet the speed requirements of the particular application for which the IC will be used. Designing different PMBs to meet the needs of different markets increases the cost of the ICs. Redesigning one of the CLBs in FIG. 2, for example, to meet the power and performance requirements of a particular application can significantly increase the development time and resources needed to bring the IC product to market.

It is desirable to simplify the process of providing an integrated circuit having a desired level of power reduction capability. It is further desirable to provide methods and structures for managing power in integrated circuits that facilitates the efficient development of a group of integrated circuits having different power and speed characteristics for market applications with different power and performance requirements.

SUMMARY

The invention provides structures and methods of efficiently implementing power management in integrated circuits (ICs). An IC includes columns of logic blocks and columns of power management blocks (PMBs). The columns of PMBs and logic blocks are placed alternately across the IC, with each PMB being coupled to a logic block in an adjacent column, and the logic blocks are coupled to each other across the columns of PMBs. The PMBs can be implemented, for example, using power gates coupled between a global power rail (either ground or power high) and a local power rail specific to the logic block coupled to the PMB.

This structure lends itself to an efficient methodology for designing ICs having reduced power consumption. For example, a PMB can be selected from a library of interchangeable PMBs based on power and performance requirements of a target application. Because the PMB is designed as a separate block and is placed alongside the logic block, instead of being included in the logic block, any of the interchangeable PMBs in the library can readily be included in the IC. The result is reduced time-to-market and reduced manpower requirements for the IC implementation process.

The library of PMBs can include, for example, PMBs having power gates of different widths and/or lengths, power gates implemented as transistors having a gate terminal coupled to receive a control signal, power gates implemented as diode-connected transistors, power gates for the ground rail, and/or power gates for the power high rail. For example, N-type transistors can be used for gating the ground rail, and/or P-type transistors can be used for gating the power high rail.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples, and can be applied to virtually any IC including logic blocks organized into columns, including, for example, custom ICs and application specific integrated circuits (ASICs). Further, it will be understood that the term "column" is used to designate direction with respect to the figures herein, and that a "column" in one embodiment can be a "row" in another embodiment.

Figure 1:
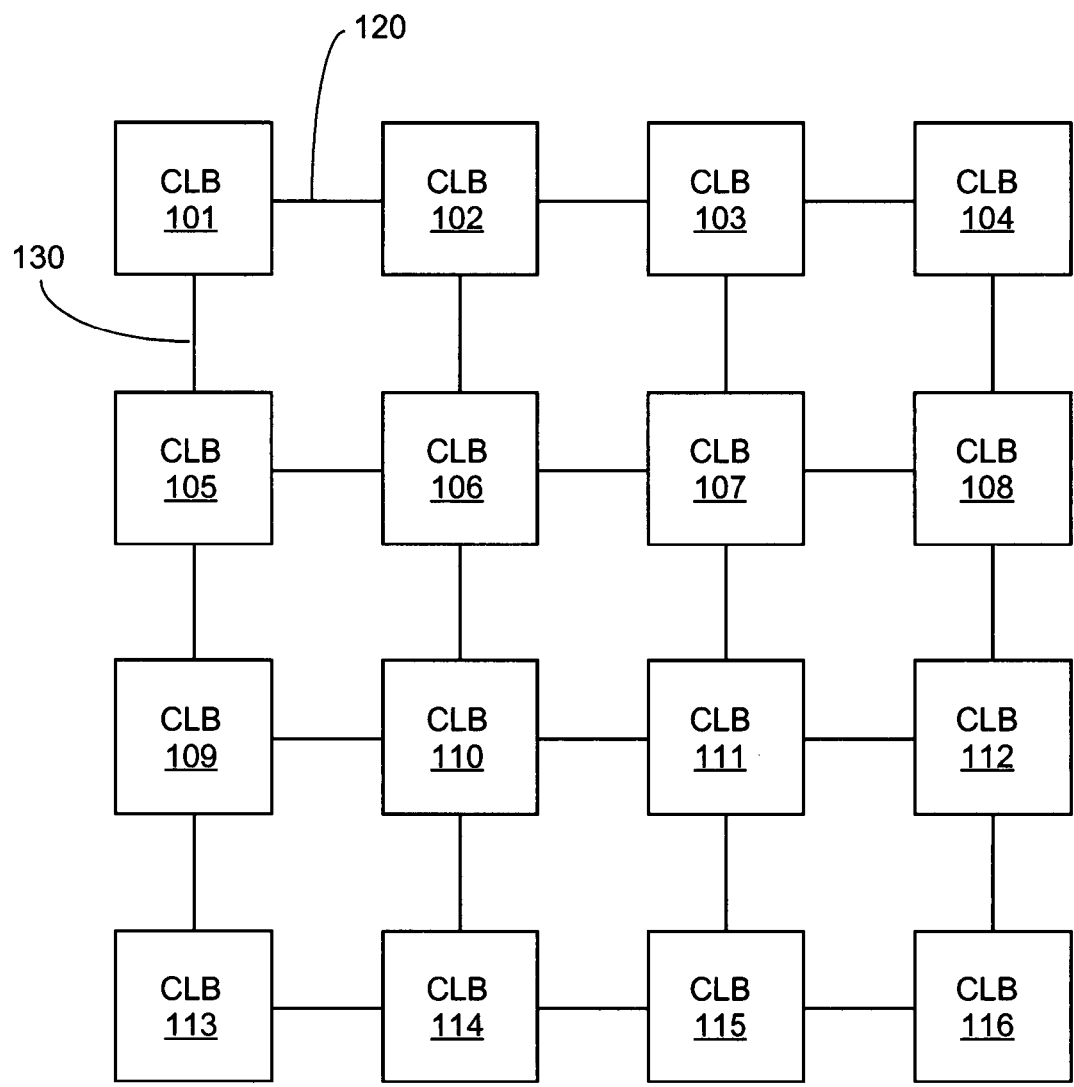
FIG. 1 is a block diagram of a known field programmable gate array (FPGA).
Figure 2:
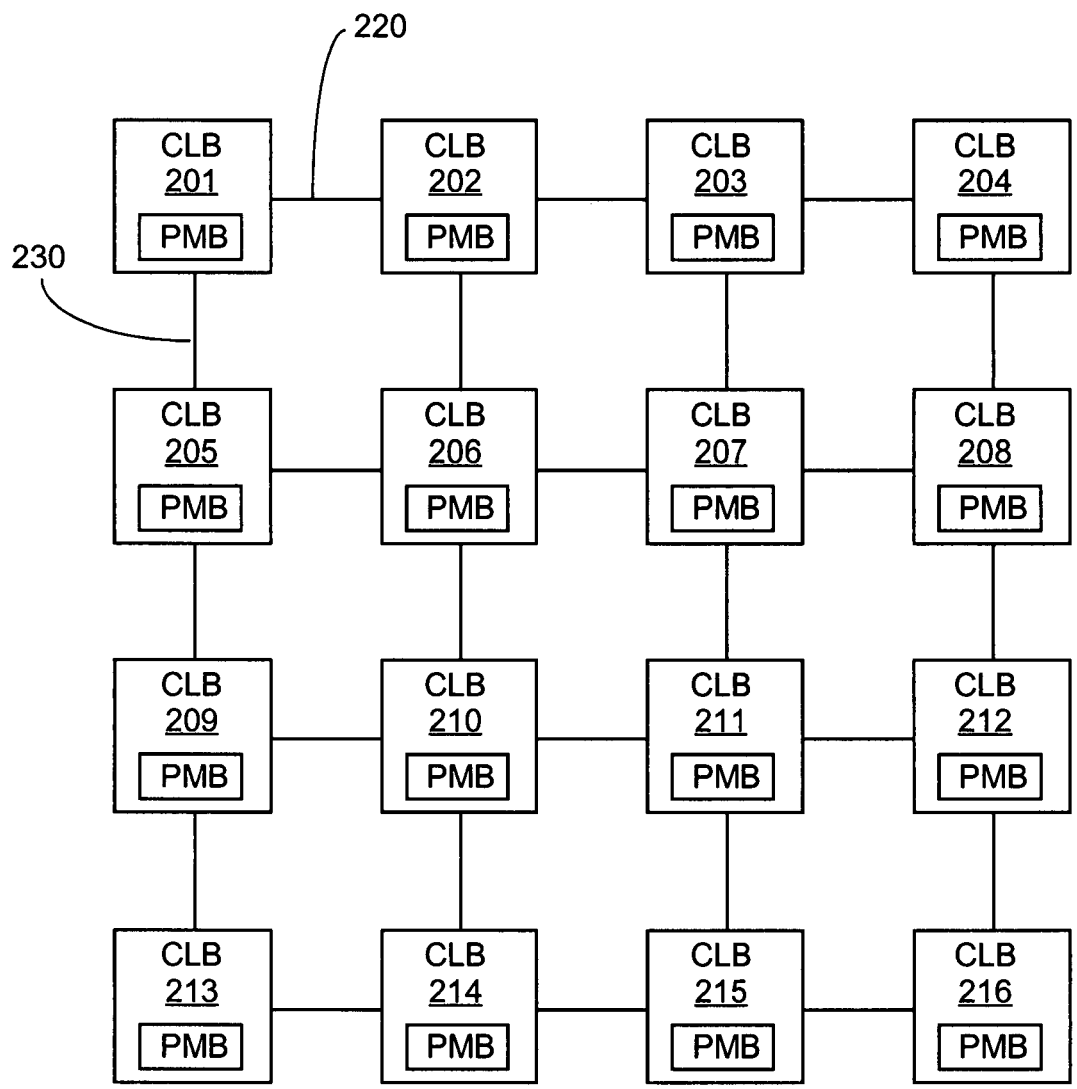
FIG. 2 is a block diagram of a known FPGA with reduced power consumption.
Figure 3:
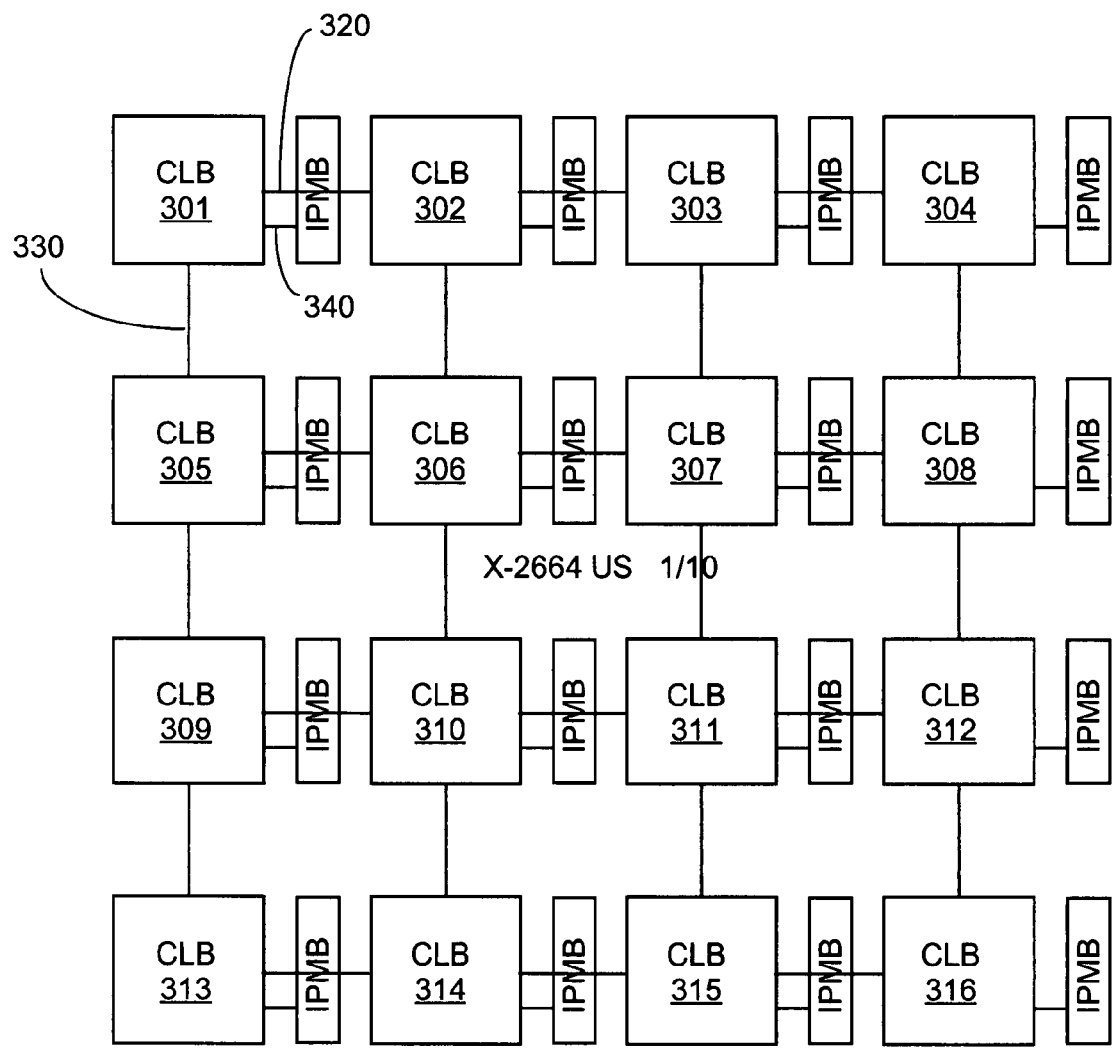
FIG. 3 is a block diagram of an FPGA designed for efficient implementation of reduced power consumption, according to an embodiment of the present invention.

FIG. 3 illustrates a field programmable gate array (FPGA) similar to the FPGA shown in FIG. 1, in that the FPGA includes an array of configurable logic blocks (CLBs) arranged in rows and columns. The CLBs 301-316 are interconnected by horizontal and vertical interconnect lines (320 and 330, respectively). However, the FPGA also includes columns of Interchangeable Power Management Blocks (IPMBs) interspersed between the columns of CLBs. Each IPMB is interconnected with a respective CLB in an adjacent column of CLBs via connectors 340. Each IPMB optionally turns off or reduces power to the associated CLB. Thus, power can be turned off or reduced within that CLB when the CLB is not in use, thereby reducing the power consumption of the FPGA when the CLB is inactive.

The PMBs shown in FIG. 3 are designated as "IPMBs" because they are interchangeable, e.g., they can optionally form part of a library of available PMBs, any one of which can easily be selected and inserted between the columns of CLBs to implement an FPGA suited to the power and performance requirements of a particular application. For example, a library of IPMBs could include one PMB designed for very low power and low speed, one PMB designed for modest power and modest performance, and one PMB designed for performance with only minimal regard for power consumption.

Figure 4:
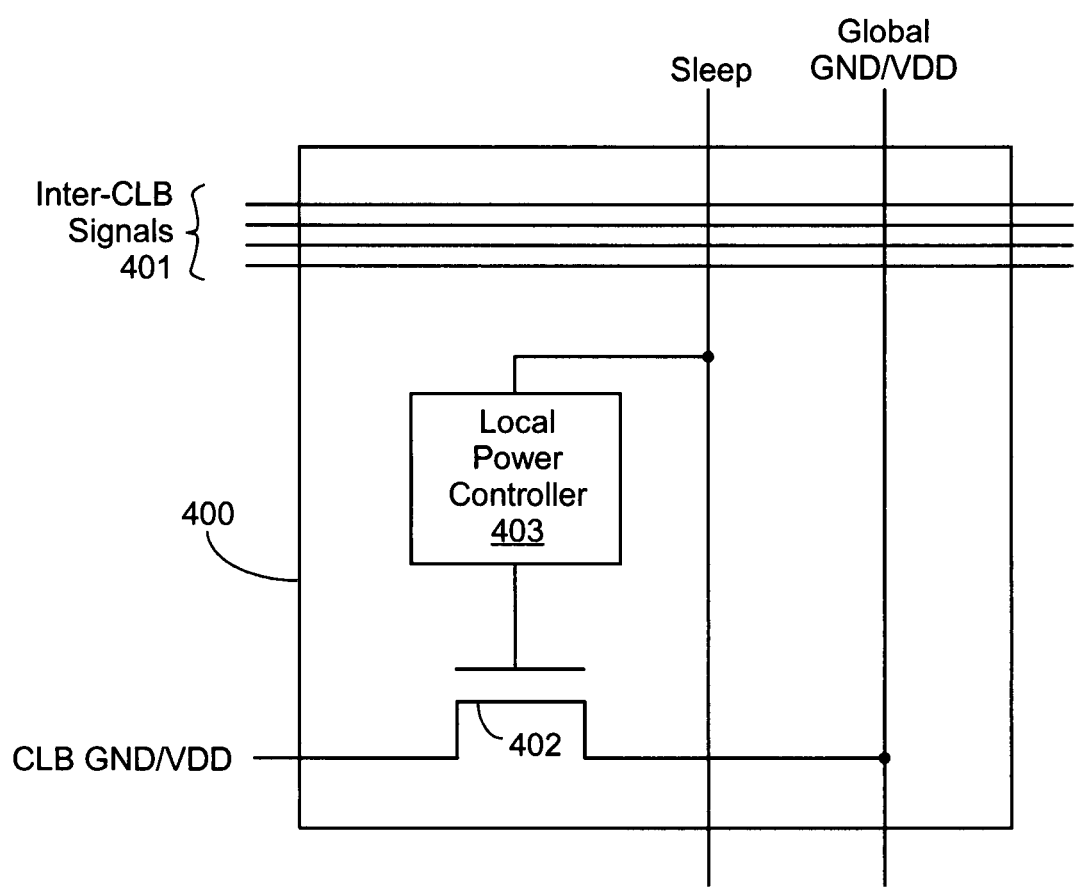
FIG. 4 illustrates a power management block (PMB) according to an embodiment of the present invention.

FIG. 4 illustrates one way in which a PMB (and/or IPMB) can be implemented to optionally reduce static power consumption using a power gate. Importantly, the technique illustrated in FIG. 4 can be applied to either the power high rail (VDD) or the ground rail (GND), or both. When applied to the power high rail, the power gate is coupled between a global power high and a local power high. When applied to the ground rail, the power gate is coupled between a global ground rail and a local ground rail. Henceforward, the exemplary IPMBs described herein (see FIGS. 6-8) include a power gate applied to the ground rail. However, it will be clear to those of skill in the art that similar techniques can be applied to the power high rail to achieve power reduction.

In the embodiment of FIG. 4, a global power rail ("Global GND/VDD") is provided to each PMB on the IC, or each PMB included in a specific portion of the IC. Each PMB 400 includes a power gate 402 (e.g., a transistor) coupled between the global power rail and a local power rail ("CLB GND/VDD") specific to the logic block to which the PMB is coupled. Additionally, each PMB 400 feeds the inter-CLB signals 401 between the two CLBs on either side of the column of PMBs while maintaining the same pitch and location on both sides of the PMB, to facilitate removing the IPMB in ICs requiring the highest possible performance.

In some embodiments, power gate 402 is an N-type transistor when the global power rail is a ground rail, and a P-type transistor when the global power rail is a power high rail. In other embodiments, other types of transistors are used. For example, in some embodiments an N-type transistor is used when the global power rail is a power high rail, and/or a P-type transistor is used when the global power rail is a ground rail.

The power gate has a gate terminal coupled to a control signal, which can be, for example, derived from a global "Sleep" signal using a local power controller 403. The local power controller could include, for example, a configuration memory cell having a first value when the associated CLB is in use (e.g., part of the user design programmed into the FPGA), and a second value when the associated CLB is not in use (e.g., not included in the user design). Thus, for example, the power gate can be enabled when the CLB is in use and the Sleep signal is low, and can be disabled when the CLB is not in use or the Sleep signal is high, or both conditions apply. When the power gate is disabled, the CLB power rail is decoupled from the global power rail, and virtually no leakage power is consumed by the CLB. When the power gate is enabled, the CLB is fully functional and its speed is only nominally affected by the presence of the power gate.

An efficient way to distribute the multiple power rails (global ground and CLB ground, for example), is to separate them into different metal layers. For global ground distributions, higher layer metals may be preferred, e.g., metal layer 4 and above. An exception to this separation into different metal layers may be when global ground traces are needed for substrate connections.

Figure 5:
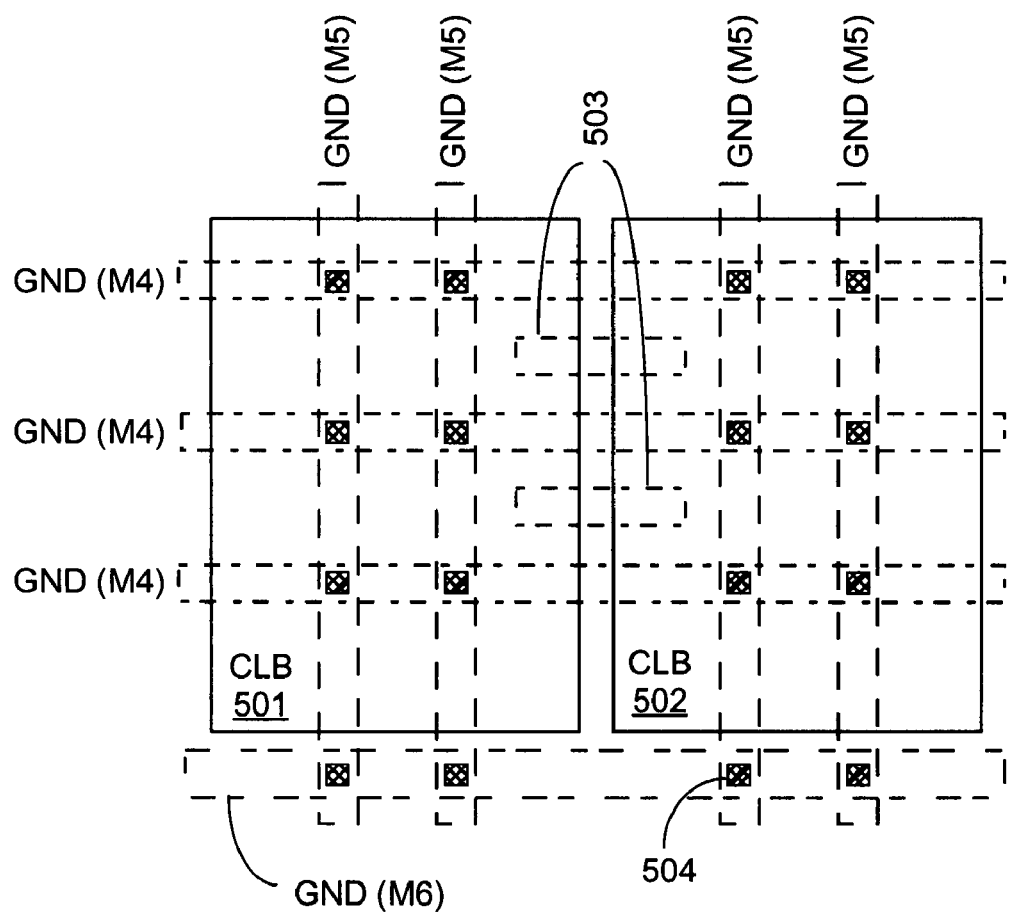
FIG. 5 is a layout diagram of a power distribution network in a conventional FPGA fabric.

FIG. 5 illustrates a conventional power distribution network utilizing metal layers 4, 5, and 6 (labeled M4, M5, and M6, respectively). Because no PMB is present, there is only one ground rail (GND), which runs horizontally in metal 6, then is dropped down to metal 5 using vias 504. Multiple ground lines then run vertically in metal 5, and hence through additional vias down to metal 4. From the horizontal metal 4 lines, the ground signal is passed further down to metal 1, and hence to the lower layers such as diffusion, wells contacts, and so forth (not shown) in the CLBs 501, 502. Horizontal metal 4 lines can also be used, for example, to run inter-CLB signals 503, for example, as shown in FIG. 5.

Figure 6:
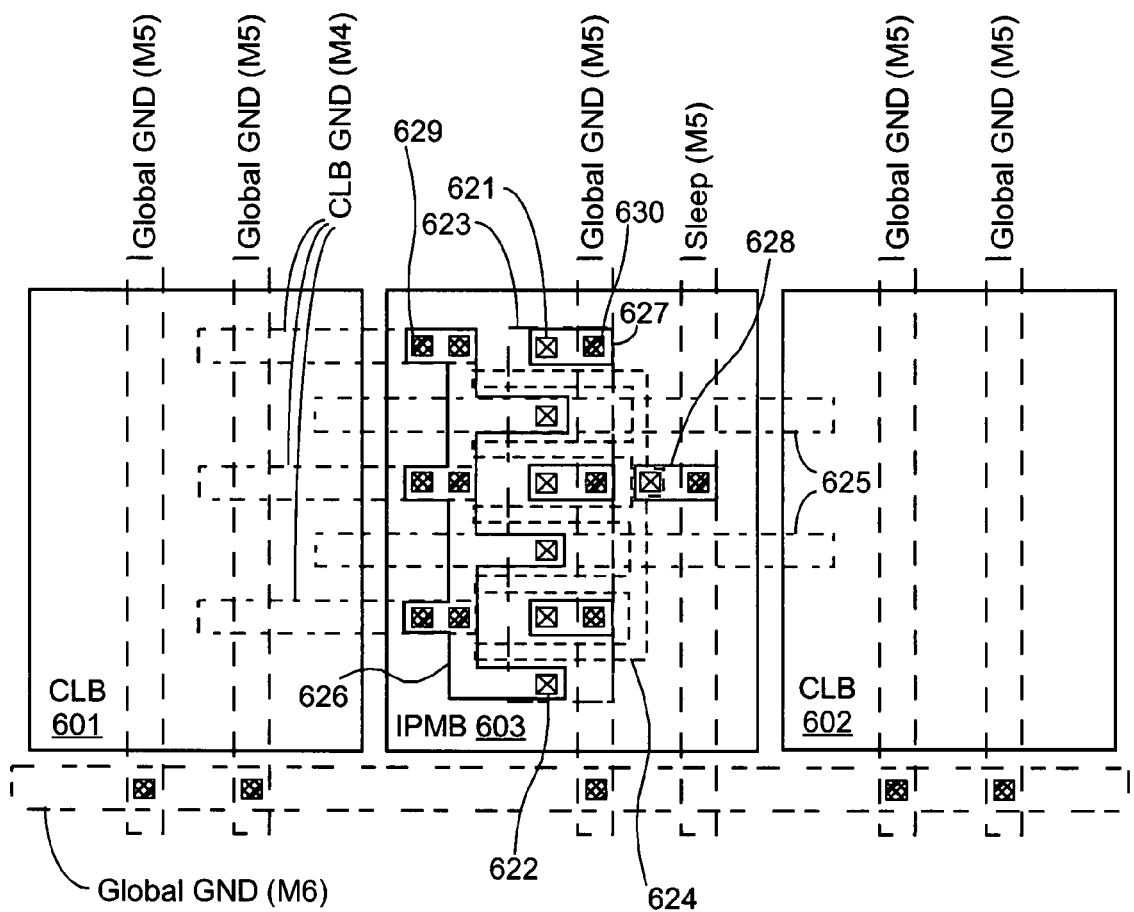
FIG. 6 is a layout diagram of a first PMB according to an embodiment of the present invention.

FIG. 6 illustrates a first example of how an interchangeable PMB can be inserted between two CLBs. IPMB 603 is disposed between CLBs 601 and 602, and is interconnected with CLB 601 but not with CLB 602. IPMB 603 is laid out in such a fashion that no changes are required to the layout of CLBs 601 and 602 when the IPMB is inserted between the CLBs. Note that it is assumed in the figures herein that the substrate connections (not shown) are already routed separately from the ground buses, and/or that all transistors connected to the local ground reside in wells.

The global ground rail runs horizontally in metal 6 and vertically in metal 5, as in the conventional implementation of FIG. 5. The ground distribution network is only altered at two metal layers, metal 4 and metal 5. All ground metals at M6 and above remain the same as in FIG. 5, and all ground metals from M4 and below are unchanged with the exception that they are now local to each CLB and are not connected to neighboring CLBs.

The global ground on metal 5 is modified to go through the power gate instead of directly connecting to the metal 4 ground, and the metal 4 ground is only distributed locally within CLB 601. The power gate (see element 402 of FIG. 4) comprises the areas where polysilicon 624 crosses the diffusion area 623. Thus, one side of the power gate is coupled to the local ground (CLB GND) through contacts 622, metal 1 626, and multi-level vias 629, while the other side of the power gate is coupled to the global ground (global GND) through contacts 621, metal 1 627, and multi-level vias 630.

As is well known in the art, a multi-level via allows two different metal layers separated by at least one other metal layer to make electrical contact to one another. A multi-level via coupling a metal 5 layer to a metal 1 layer (e.g., via 630) includes a piece of each metal layer between the two coupled layers, i.e., M2, M3, and M4, as well as a via that permits contact between each of these layers. These vias may or may not be allowed to overlap, depending on the design rules specific to the process. For clarity, FIGS. 6-8 are drawn with the assumption that a multi-level via can be implemented as a group of "stacked" vias and metal layers, and the details of these connections are not included in the figures.

Polysilicon 624 is coupled through a contact to metal 1 628, and hence through a multi-level via to a metal 5 line carrying a "Sleep" signal. Thus, it is clear that in this exemplary embodiment the power gate is directly controlled by the Sleep signal, and no local power controller (see element 403 of FIG. 4) is included in the PMB. The local power controller is optional, and may be included or omitted. The local power controller is omitted from the exemplary layouts shown in FIGS. 6-8, for clarity. However, it will be clear to those of skill in the art that these circuits may be included in the illustrated IPMBs without disrupting either the power distribution network or the local inter-CLB signals 625 that interconnect the CLBs 601, 602 on either side of the IPMB 603. This may be most easily accomplished by restricting the control circuit layouts to the use of the three lower metal layers (i.e., M1, M2, and M3) to avoid obstructing the inter-CLB signals 625.

The term "interchangeable PMB" implies that there exist multiple PMBs that can be seamlessly dropped into the same baseline fabric of logic blocks. Such IPMBs can be generated in several different ways, including, but not limited to, the methods described here.

Figure 7:
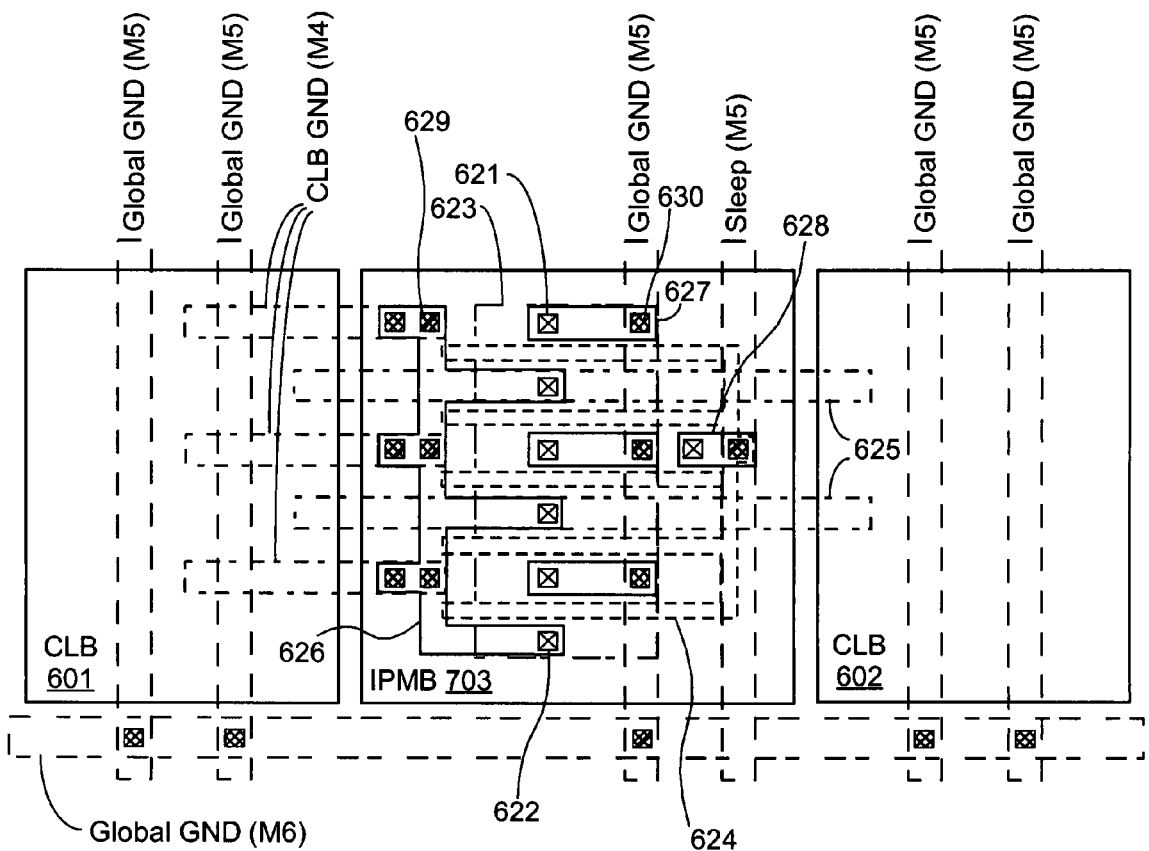
FIG. 7 is a layout diagram of a second PMB according to an embodiment of the present invention.
Figure 8:
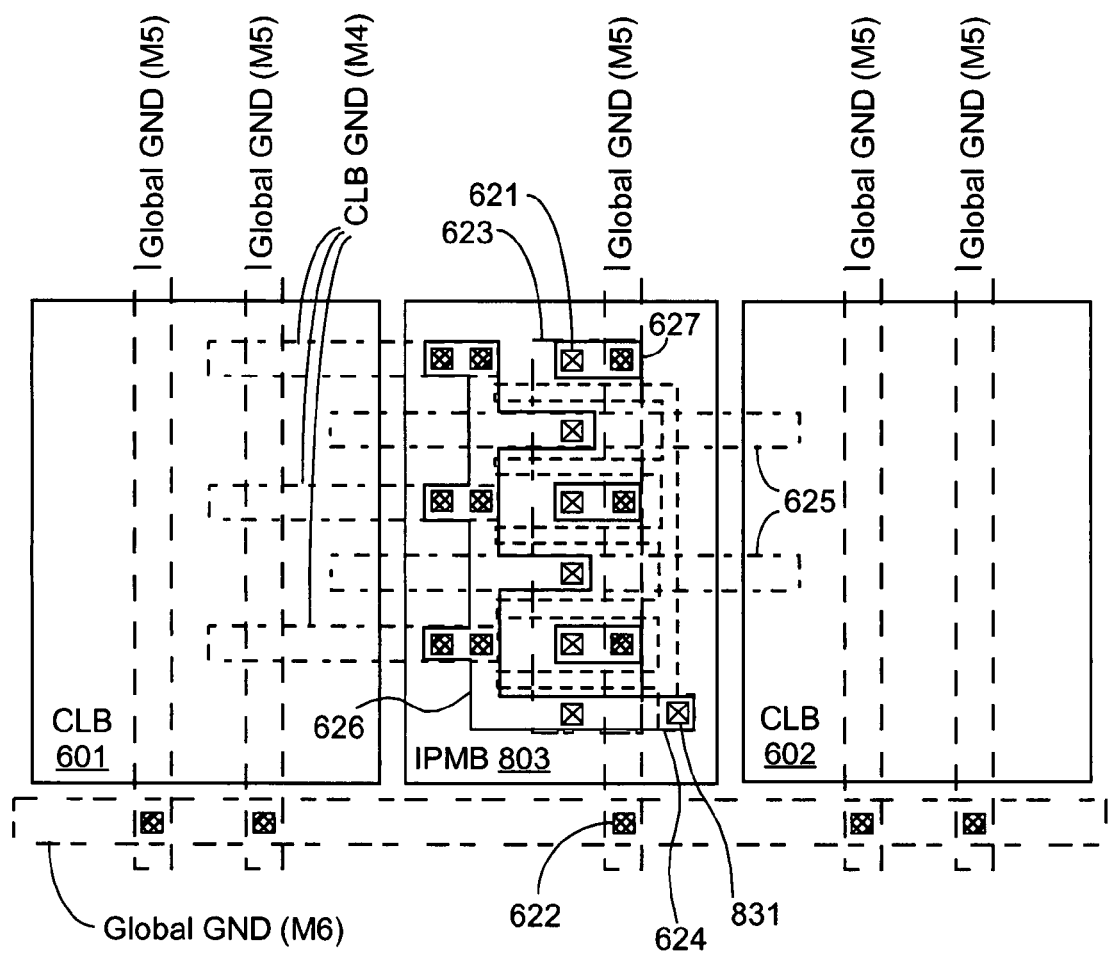
FIG. 8 is a layout diagram of a third PMB according to an embodiment of the present invention.

FIG. 7 provides an example of one way in which a "library" of IPMBs can be developed, each of which can be seamlessly dropped into a baseline fabric of logic blocks. This method simply involves changing one or both dimensions of the power gate. For example, the IPMB 703 of FIG. 7 is very similar to the IPMB 603 of FIG. 6, except that the width of the power gate has been increased, without impacting the locations of the inter-CLB signals. In another embodiment, the length of the power gate is adjusted in addition to or instead of adjusting the width.

The dimensions of the power gate can have a powerful effect on the operating characteristics of the associated CLB. For example, power gate dimensions determine the CLB power reduction when the power gate is disabled ("off") and the CLB speed degradation when the power gate is enabled ("on"). For example, if the power gate is sized to equal the equivalent total pull-down width of the CLB, then the speed degradation is very little (e.g., a few percent), while the power reduction may also be relatively small (2-10 times). If the power gate is sized to equal 10 percent of the total pull-down width of the CLB, and the length of the power gate is increased by 25 percent, then the speed degradation may be higher (e.g., greater than 10 percent), but the power reduction may also be higher (e.g., greater than 100 times).

FIG. 8 provides another IPMB that can be interchangeable with the IPMBs of FIGS. 6 and 7, for example. The IPMB of FIG. 8 includes a power gate implemented as a diode-connected transistor. In the pictured embodiment, the power gate is an N-type transistor used as a power gate to ground, and the gate terminal of the transistor is coupled to the drain of the transistor, which in this case is the local power side of the transistor. Thus, in the pictured embodiment polysilicon 624 is coupled to CLB-GND through contact 831 and metal 1 626. When a P-type transistor is used as a power gate to power high, the gate terminal of the transistor is similarly coupled to the local power side of the transistor. Conversely, when an N-type transistor is used as a power gate to power high, and/or when a P-type transistor is used as a power gate to ground, then the gate terminal is coupled to the source, which in these cases is the global power side of the transistor.

The use of a diode-connected power gate creates a lower voltage across the CLB compared to the IPMB of FIG. 6, although the dimensions of the power gate are the same. The IPMB of FIG. 8 may be useful when the power gate is disabled, for example, for reducing power while still supplying enough power to retain the content of configuration memory cells or other memory elements in the associated logic block. When the power gate is enabled, the IPMB of FIG. 8 produces a low-power mode with functionality at a reduced speed.

Figure 9:
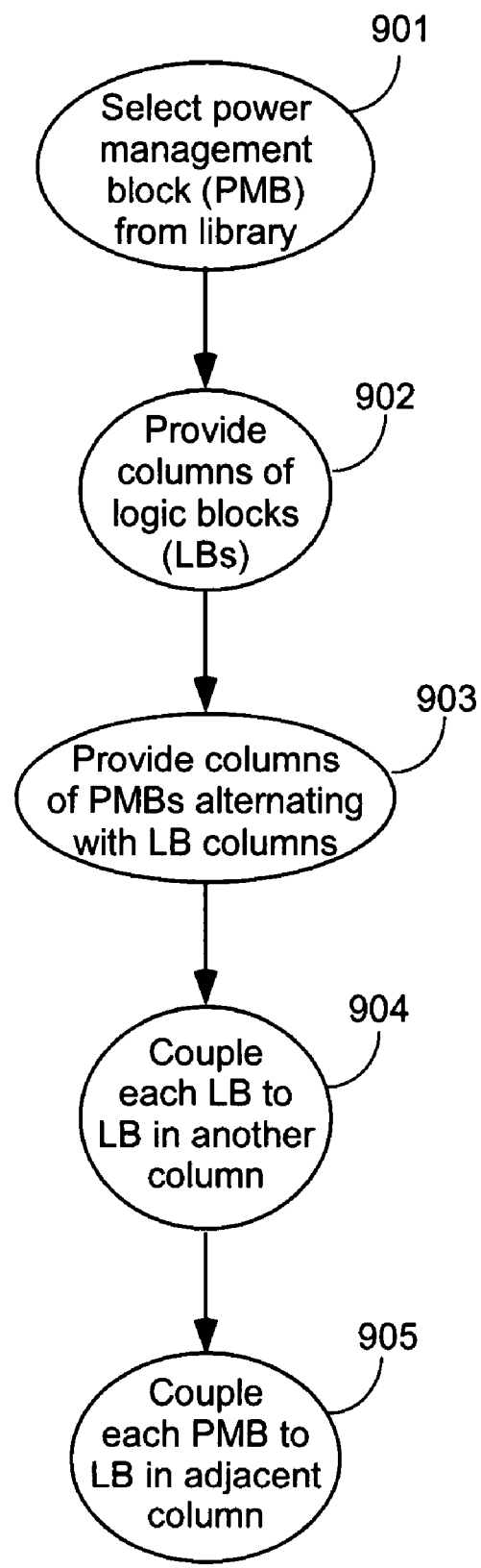
FIG. 9 illustrates the steps of a first method of designing an integrated circuit, according to an embodiment of the present invention.

FIG. 9 illustrates the steps of a first method of designing an integrated circuit (IC), according to an embodiment of the present invention. In step 901, a power management block (PMB) is selected from a library of interchangeable PMBs, based on power and performance requirements of a target application. Each of the PMBs can include, for example, a power gate coupled between a global power rail (either ground or power high) and a local power rail. The global power rail is shared by two or more of the PMBs, while the local power rail for each PMB is coupled to a respective logic block coupled to the PMB. The power gate can be, for example, a transistor controlled by a control signal, or a diode-connected transistor. Each of the PMBs can further include, for example, a local power controller coupled to a gate terminal of the power gate. The library of PMBs can include, for example, PMBs having power gates of different widths, different lengths, different configurations of transistors, and so forth.

In step 902, two or more columns of logic blocks (LBs) are provided in the IC. In step 903, two or more columns of the PMBs are provided, with the LB columns and the PMB columns alternating across the IC.

In steps 904-905, the various columns in the IC are interconnected. In step 904, each logic block is coupled to at least one logic block in at least one other column of logic blocks. For example, logic blocks in the center of the IC may be connected to two logic blocks in two adjacent columns, while a logic block along the edge of the IC may be connected to only one logic block in one adjacent column. In step 905, each PMB is coupled to a respective logic block in an adjacent column of logic blocks.

Note that the steps illustrated in FIG. 9 need not be performed in the order shown, and some or all of the steps may be performed concurrently rather than consecutively. For example, the interconnections provided in steps 904 and 905 may be included in a layout cell for a PMB, so that the step of providing the columns of PMBs (step 903) may also result in the addition of the connections added in steps 904 and 905.

Figure 10:
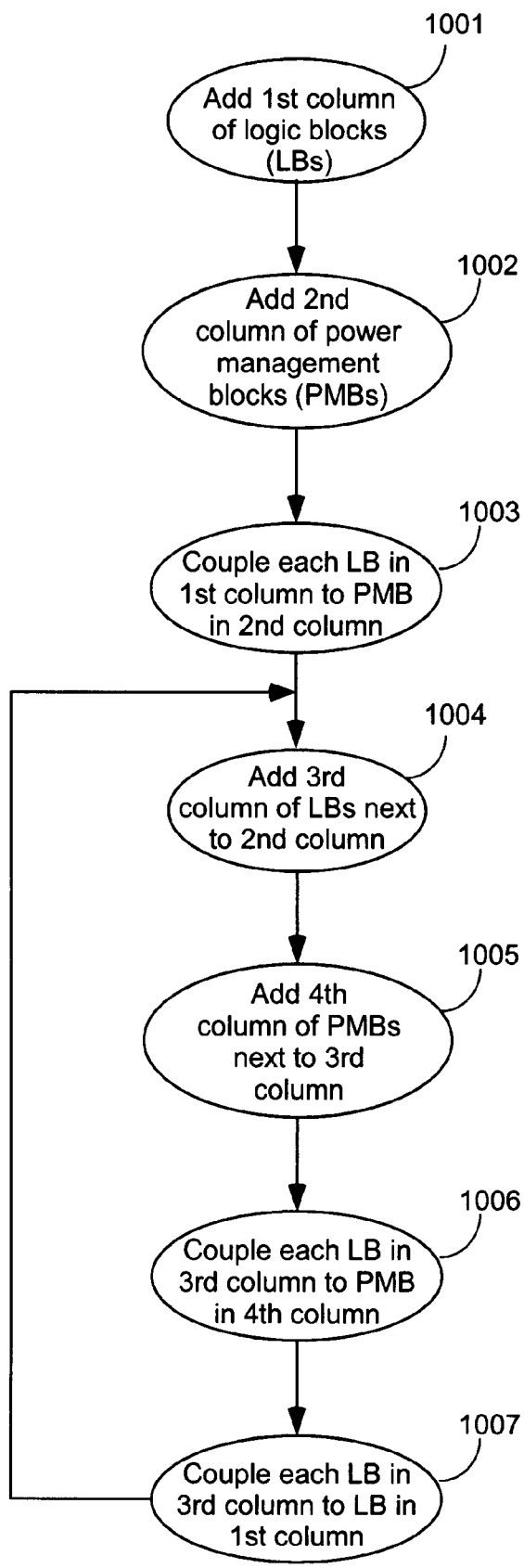
FIG. 10 illustrates the steps of a second method of designing an integrated circuit, according to an embodiment of the present invention.

FIG. 10 illustrates the steps of a second method of designing an integrated circuit (IC), according to an embodiment of the present invention. In step 1001, a first column of logic blocks is added to the IC. In step 1002, a second column is added to the IC. The second column includes power management blocks (PMBs), and is disposed adjacent to the first column. In step 1003, each logic block in the first column is coupled to a respective one of the PMBs in the second column. Note that this step may be performed concurrently with step 1003. In other words, the interconnections provided in steps 1003 may be included in a layout cell for a PMB, so that the step of providing the column of PMBs (step 1002) may result in the addition of the connections added in step 1003.

In step 1004, a third column of logic blocks is added to the IC, disposed adjacent to the second column. In step 1005, a fourth column of PMBs is added to the IC, disposed adjacent to the third column. In step 1006, each logic block in the third column is coupled to a respective PMB in the fourth column. In step 1007, each logic block in the third column is coupled to a respective logic block in the first column.

Note that the steps illustrated in FIG. 10 need not be performed in the order shown, and some or all of the steps may be performed concurrently rather than consecutively. For example, the interconnections provided in step 1006 may be included in a layout cell for a PMB in the fourth column, so that the step of providing the fourth column of PMBs (step 1005) may result in the addition of the connections added in step 1006. Similarly, the interconnections provided in step 1007 may be included in a layout cell for a PMB in the second column, so that the step of providing the second column of PMBs (step 1002) may result in the addition of the connections added in step 1007.

Steps 1004-1007 may be repeated as desired until the entire IC has been provided, as shown in FIG. 10. Alternatively or additionally, columns or blocks of logic not having power reduction capability (e.g., not having associated PMBs) may also be added to the IC. Note also that the logic blocks need not all be of the same type. For example, a programmable IC may include columns of CLBs interspersed with columns of IOBs, BRAMs, and so forth. Some or all of these columns may include PMBs such as those described herein. In some embodiments, different IPMBs are selected from a library of available PMBs for different columns, e.g., when the columns comprise different types of logic blocks. In other embodiments, only one type of IPMB is used throughout an IC.

Those having skill in the relevant arts of the invention will now perceive various modifications and additions that can be made as a result of the disclosure herein. For example, the above text describes the structures and methods of the invention in the context of programmable ICs such as programmable logic devices (PLDs). However, the invention can also be applied to non-programmable ICs, for example. Further, the examples used herein are selected for simplicity and clarity in illustrating the invention. Although such structures are not illustrated herein, the described techniques can readily be applied to ICs including logic blocks arrayed in less regular fashion, e.g., an array of logic blocks can include variously-sized blocks such as RAMs (random access memories), DSP (digital signal processing) units, and processors.

Further, logic blocks, configurable logic blocks, power management blocks, interchangeable power management blocks, transistors, N-type transistors, P-type transistors, power gates, diode-connected transistors, local power controllers, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Claims including method steps do not necessarily imply that the steps be performed in the order shown.

What is claimed is:

1. A computer-implemented method of designing an integrated circuit (IC), comprising:
   selecting a power management block from a library of interchangeable power management blocks based on power and performance requirements of a target application;
   providing, by a computer, a plurality of columns of logic blocks;
   providing, by the computer, a plurality of columns of power management blocks, wherein the columns of logic blocks and the columns of power management blocks are alternately disposed across the IC;
   coupling each logic block to at least one logic block in at least one other column of logic blocks; and
   coupling each power management block to a respective logic block in an adjacent column of logic blocks,
   wherein:
   providing the plurality of columns of power management blocks comprises providing a plurality of columns of the selected power management blocks, and
   the library of interchangeable power management blocks comprises a plurality of power management blocks each having a power gate coupled between a global power rail and a local power rail, wherein:
   the global power rail is shared by a plurality of the power management blocks, and
   for each power management block, the local power rail is coupled to the respective logic block coupled to the power management block.

2. The method of claim 1, wherein each of the power management blocks further comprises:
   a local power controller coupled to a gate terminal of the power gate.

3. The method of claim 1, wherein in at least one of the power management blocks in the library the power gate comprises a transistor having a gate terminal coupled to receive a control signal.

4. The method of claim 1, wherein in at least one of the power management blocks in the library the power gate comprises a diode-connected transistor.

5. The method of claim 1, wherein at least one of the power management blocks in the library comprises a power gate having a first width different from a second width of a power gate in another of the power management blocks in the library.

6. The method of claim 1, wherein:
the global power rail comprises a global ground rail; and
the local power rail comprises a local ground rail.

7. A computer-implemented method of designing an integrated circuit (IC), comprising:
selecting a power management block from a library of interchangeable power management blocks;
adding, by a computer, a first column of logic blocks to the IC;
adding, by the computer, a second column of power management blocks disposed adjacent to the first column;
coupling each logic block in the first column to a respective one of the power management blocks in the second column;
adding, by the computer, a third column of logic blocks disposed adjacent to the second column;
adding, by the computer, a fourth column of the power management blocks disposed adjacent to the third column;
coupling each logic block in the third column to a respective one of the power management blocks in the fourth column; and
coupling each logic block in the third column to a respective one of the logic blocks in the first column,
wherein:
adding a second column of power management blocks comprises adding a column of the selected power management blocks, and
the library of interchangeable power management blocks comprises a plurality of power management blocks each having a power gate coupled between a global power rail and a local power rail, wherein:
the global power rail is shared by a plurality of the power management blocks, and
for each power management block, the local power rail is coupled to the respective logic block coupled to the power management block.

8. The method of claim 7, wherein at least one of the power management blocks in the library further comprises:
a local power controller coupled to a gate terminal of the power gate.

9. The method of claim 7, wherein at least one of the power management blocks in the library comprises a power gate having a first width different from as second width of a power gate in another of the power management blocks in the library.

10. The method of claim 7, wherein:
in at least a first one of the power management blocks in the library the power gate comprises a transistor having a gate terminal coupled to receive a control signal; and
in at least a second one of the power management blocks in the library the power gate comprises a diode-connected transistor.

\* \* \* \* \*